United States Patent [19]

Harigane et al.

[11] Patent Number: 5,029,384
[45] Date of Patent: Jul. 9, 1991

[54] APPARATUS FOR MOUNTING ELECTRONIC DEVICE ON A PRINTED CIRCUIT BOARD

[75] Inventors: Kotaro Harigane; Tetsuro Ito; Atsushi Shindo, all of Tokyo, Japan

[73] Assignee: TDK Corporation, Tokyo, Japan

[21] Appl. No.: 402,320

[22] Filed: Sep. 1, 1989

[30] Foreign Application Priority Data

Sep. 2, 1988 [JP] Japan ................. 63-218426

[51] Int. Cl.⁵ .............................................. H05K 3/00
[52] U.S. Cl. ........................................ 29/741; 29/759; 29/760
[58] Field of Search ................ 29/739, 741, 747, 748, 29/837, 838, 839, 845, 564, 564.1, 759, 760

[56] References Cited

U.S. PATENT DOCUMENTS 4,293,999 10/1981 Woodman, Jr. ................ 29/741 X
4,329,776 5/1982 Mori et al. ........................ 29/741
4,434,550 3/1984 Wilke et al. ..................... 29/741 X
4,443,936 4/1984 Lazaro, Jr. ...................... 29/748 X

FOREIGN PATENT DOCUMENTS 63-114578 9/1988 Japan .
1-286499 11/1989 Japan .

Primary Examiner—Joseph M. Gorski
Assistant Examiner—Peter Dungba Vo
Attorney, Agent, or Firm—Armstrong, Nikaido, Marmelstein, Kubovcik & Murray

[57] ABSTRACT

An apparatus for automatically mounting an electronic device having a plurality of leads on a printed circuit board, by inserting the leads into mount holes of the printed circuit board. A plurality of extension pins are connected straight to the leads to hold the leads of the electronic device. The extension pins are inserted into the mount holes, while the connection between the extension pins and the leads is maintained. The extension pins are then removed from an opposite side of the printed circuit board, thus guiding and inserting the tips of the leads into the mount holes.

7 Claims, 3 Drawing Sheets

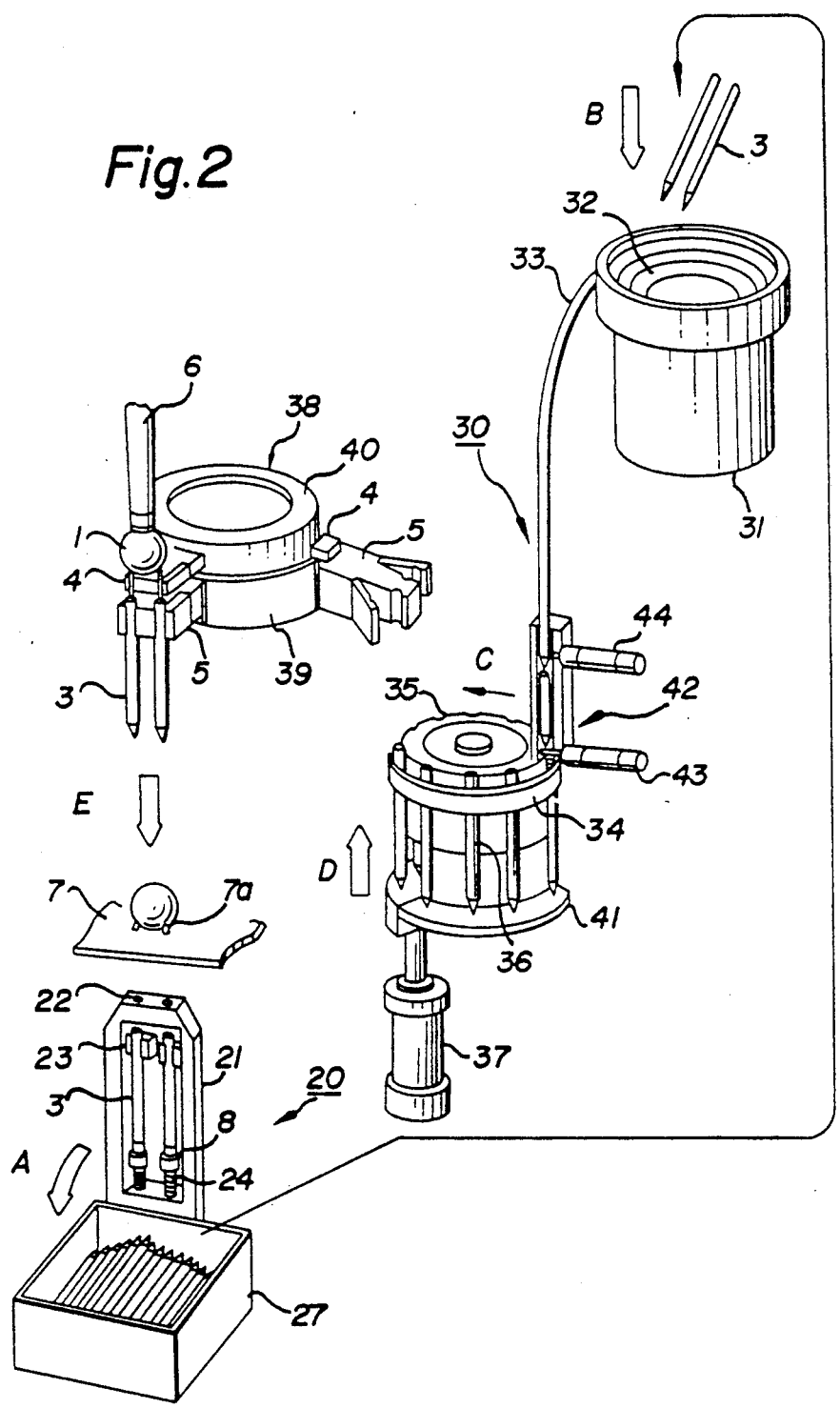

APPARATUS FOR MOUNTING ELECTRONIC DEVICE ON A PRINTED CIRCUIT BOARD

BACKGROUND OF THE INVENTION

1. Field of the Invention

This invention relates to a method and apparatus for mounting an electronic device on a printed circuit board, more particularly to such a method and apparatus for inserting leads of an electronic device into mount holes of the printed circuit board, in which extension pins are used for guiding the leads to the mount holes.

2. Description of the Related Art

In a conventional known method or apparatus for mounting an electronic device having a plurality of leads, a guide members have been generally used for holding and guiding the leads of the electronic device to insert them into the mount holes of the printed circuit board, as shown in FIGS. 3A-3E.

However, in such a conventional method or apparatus, various kinds of guide members must be prepared and used according to the shapes, dimensions, or the like of the individual electronic devices. For example, in order to hold a relatively large sized device 10a, an insertion guide 11a having a deep holding arm must be used, as shown in FIG. 3A, and, on the other hand, in order to hold a relatively small sized device 10b, an insertion guide 11b having a shallow holding arm should be used, as shown in FIG. 3B. In other words, if a single, same insertion guide 11 is used, a part 11c thereof might contact a portion of the electronic device 10 so that the insertion guide 11 could no longer hold and insert the leads of the device, as shown in FIG. 3C. On the other hand, if a large insertion guide 11a having a deep holding arm is used to hold a relatively thin device 10b, the excess space S used by the same would decrease the efficiency of device mounting, as shown in FIG. 3D.

In addition, the insertion guide 11 must hold the leads of the electronic device 10 from the upper side of the printed circuit board 13, so the space I for inserting the device 10 must be larger than the size of the body of the device 10 to be mounted. If there is not enough space, when trying to insert the leads into the mount or through holes 14 of the printed circuit board 13, the insertion guide 11 might come into contact with adjacent devices 12, making insertion impossible. Also, the adjacent devices 12 might be damaged by the insertion guide 11.

SUMMARY OF THE INVENTION

Accordingly, an object of the present invention is to provide a method and apparatus for mounting an electronic device on a printed circuit board eliminating the need for dulprent shapes of insertion guides for inserting electronic devices having different shapes and/or dimensions.

Another object of the present invention is to provide a method and apparatus for mounting an electronic device on a printed circuit board, in which an electronic device can be inserted into mount holes of the printed circuit board without interfering and/or damaging the adjacent devices mounted on the same circuit board, even if the space for inserting the device is narrow.

According to the present invention, there is provided a method for automatically mounting an electronic device having one or more leads on a printed circuit board, by inserting the leads into mount holes of the printed circuit board, including the steps of: connecting one or more extension pins at one end thereof to tips of the leads, so as, to hold the leads of the electronic device, inserting the extension pins at the other ends into the mount holes, and removing the extension pins from the opposite side of the printed circuit board, thus guiding and inserting the tips of the leads into the mount holes.

Another aspect of this invention is a method for automatically mounting an electronic device having one or more leads on a printed circuit board by inserting the leads into mount holes of the printed circuit board, including the steps of: holding and guiding a these same number of extension pins as the number of leads of the electronic device at an upper side of the printed circuit board; connecting the extension pins at one ends thereof to tips of the leads, to hold the leads of the electronic device; inserting the extension pins at the other ends thereof into the mount holes, while the connection between the extension pins and the leads is maintained; holding the other ends of the extension pins partially passed through the mount holes at an opposite side of the printed circuit board; releasing the hold on the extension pins at the upper side of the printed circuit board; and lowering the extension pins to completely pass through the mount holes, while the connection between the extension pins and the leads is still maintained, whereby the tips of the leads are guided and inserted into the mount holes.

Still another aspect of this invention is an apparatus for automatically mounting an electronic device having one or more leads on a printed circuit board by inserting the leads into mount holes of the printed circuit board, including; first holding means for holding the electronic device by the leads thereof at an upper side of the printed circuit board; second holding means for holding the same number of extension pins as the number of the leads of the electronic device in the vicinity of the upper ends of these extension pins; third holding means for holding the extension pins by lower ends thereof at an opposite side of the printed circuit board; and means for controlling the first, second, and third holding means so that the extension pins are held and guided to the upper side of the printed circuit board; the extension pins are connected at one ends thereof to tips of the leads; the extension pins are inserted at the other ends thereof into the mount holes, while the connection between the extension pins and the leads is maintained; the other ends of the extension pins are held at the opposite side of the printed circuit board, when the extension pins partially pass through the mount holes; the hold of the extension pins is released at the upper side of the printed circuit board; and the extension pins are lowered to completely pass through the mount holes, while the connection between the extension pins and the leads is still maintained, whereby the tips of the leads are guided and inserted into the mount holes.

In the method and apparatus of this invention for mounting an electronic device on a printed circuit board, the first and second holding means do not have to come close to the surface of the printed circuit board. Therefore, these holding means are prevented from coming into contact or interfering with adjacent devices already mounted on the same circuit board, so that only a narrow space for inserting the device in question is sufficient. In addition, the leads of the electronic device can be held transversely, so that the same holding means can be used for holding various electronic device having different shapes and/or dimensions.

BRIEF DESCRIPTION OF THE DRAWINGS

FIG. 2 is a perspective view of an apparatus of this invention, particularly illustrating a flow of extension pins which are collected and circulate.

DESCRIPTION OF THE PREFERRED EMBODIMENTS

Figure 1:
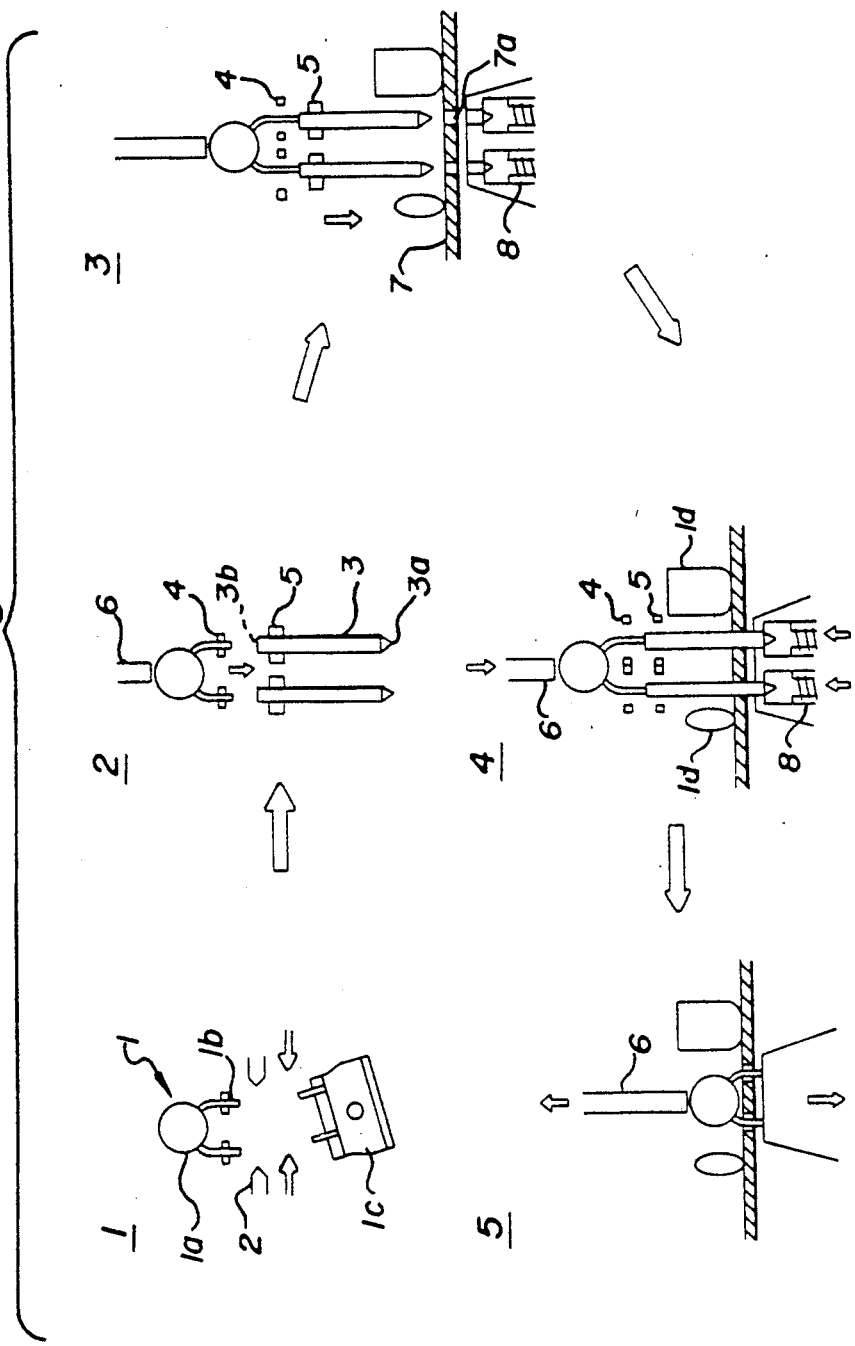
FIG. 1 is a schematic view for illustrating a process for automatically inserting an electronic device having leads according to the present invention.
Figure 3A:
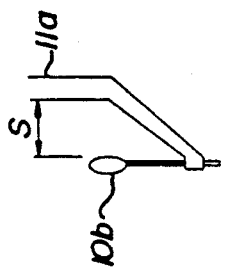
FIG. 3A to 3E are views for explaining conventionally known methods for inserting an electronic device having leads.
Figure 3B:
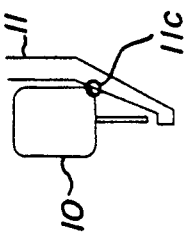
Figure 3C:
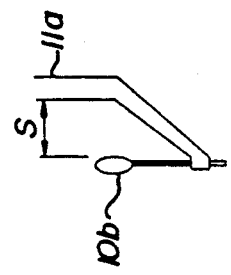
Figure 3D:
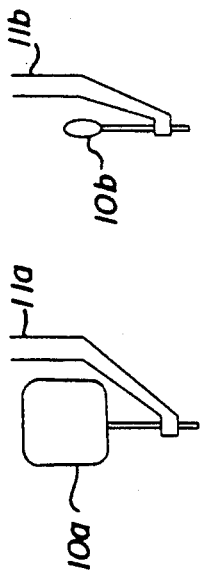
Figure 3E:
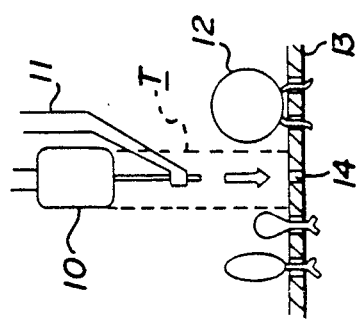

FIG. 1, shows the process for automatically inserting an electronic device having a plurality of leads.

Referring to circle 1 in the figure, a plurality of electronic devices 1, each having one or more leads 1b, is supplied in series in a longitudinal direction. Specifically, the leads 1b thereof are adhered between base and adhesion tapes 1c at certain intervals so that the plurality of devices are supported continuously to constitute a running tape of electronic devices. Electronic devices 1 are cut off from each other one by cutting the base and adhesion tapes 1c at an intermediate portion between adjacent devices. Then, the devices are cut off from the piece of the base and adhesion tapes 1c still attacked thereto by cutting the leads by an appropriate cutter 2 to obtain electronic devices with a plurality of leads each having a certain length. The method for cutting an electronic device from base and adhesion tapes 1c which can be used here is described in detail in Japanese Patent Application No. 63-114578 filed on May 13, 1988 by the same assignee of this application.

Referring to circle 2 in the figure.

The electronic device 1 is held by a first holding means, e.g., clamp 4, so that the plurality of leads, two in this embodiment, are held in parallel to exactly correspond to a predetermined insertion pitch. Here, the electronic device 1 is in an upright or vertical state, the body 1a thereof being an upper side and the leads 1b being a lower side.

Extension pins 3 are prepared. Each extension pin 3 has a diameter enabling it to freely pass through a mount or through hole 7a of the printed substrate 7, a tapered lower end 3a for easily inserting this extension pin into the mount hole 7a, and an upper end recess 3b for easily guiding the tip of the lead. The extension pin 3 may be provided at the upper end thereof with a hole or notch (not shown) instead of the recess 3b. Also, the lower end of the extension pin 3 may be round or shaped in any other way to enable easy insertion. The extension pin 3 can be made of any suitable plastic tube or pipe cut a predetermined length. Such a plastic tube or pipe may be continuously wound off from a drum and cut to obtain extension pins which are supplied, in turn, to a second holding means, e.g., clamp 5, as will be mentioned later.

The second holding means, e.g., clamp 5 holds the upper portions of the same number of extension pins 3, e.g., two pins 3, as the number the leads 1b, such that the extension pins 3 are vertically positioned just under the leads 1b and held parallel to each other so as to exactly correspond to the pitch of the leads 1b of the electronic device 1. While the first clamp 4 holds the leads 1b, a pressing means, e.g., pusher 6 located above the body 1a of the electronic device 1, and the first clamp 4 are lowered to push down the device 1, so that the tips of the leads 1b are positioned in the recesses 3b at the upper ends of the extension pins 3, and therefore connecting the pins 3 straight to the leads 1b.

Referring to circle 3 in the Figure, after the extension pins 3 are connected to the leads 1b, the first clamp 4 is opened and retracted to allow the body 1a of the device 1 and the pusher 6 to move down. The pusher 6 continues to be lowered until the tapered lower ends of the extension pins 3 are inserted into the mount holes 7a. At this time, the connection between the extension pins 3 and the leads 1b is maintained.

Referring to circle 4 in the FIG., at the opposite side of the printed circuit board 7, third holding means 8 which is built as a clinch means (not shown in detail) stands by to receive the lower ends 3a of the extension pins 3. The extension pins 3 and the electronic device 1 are, therefore, lowered together until the lower ends 3a of the extension pins 3 reach this third holding means 8. During this operation, the second clamp 5 is also lowered. When the lower ends 3a of the extension pins 3 reach the third holding means 8, the second clamp 5 is opened laterally to release the extension pins 3 and are retracted to allow the body 1a of the device 1 and the pusher 6 to move down thereafter. At this time, the second clamp 5 is positioned away from contact with adjacent devices 1d mounted on the same printed circuit board 7. The extension pins 3 are, thus, held by the third holding means 8 located under the substrate 7 and the electronic device 1 is held in position between the extension pins 3 and the pusher 6.

Referring to circle 5 in the Figure, while the extension pins 3 and the device 1 are being retained as mentioned above, the pusher 6 is further lowered until the leads 1b of the device 1 are inserted into the mount holes 7a of the printed circuit board 7. During this operation, the third holding means 8 is also lowered. After the extension pins 3 completely pass through the mount holes 7a, i.e., the tips of the leads 1b are guided and inserted into the mount holes 7a, the extension pins 3 are withdrawn at the clinching means, as will be mentioned in detail hereinafter. After the insertion of the leads 1b of the electronic device is completed, the leads 1b are bent (not shown) by the clinching means at the lower side of the printed circuit board 7. Then, the pusher 6 is moved up and the third holding means 8, the first clamp 4, and the second clamp 5 return to their initial positions.

This completes one cycle of the process for inserting an electronic device. This cycle is repeated. The extension pins 3 are collected at each cycle of the device inserting operation and returned for repeated use.

FIG. 2 shows an example of the flow of the extension pins and illustrates a pin collector 20 for collecting the extension pins 3 and a pin supply 30 for supplying the collected extension pins.

The pin collector 20 is located under the printed circuit board 7 and includes a supporting collecting case 21, which is included in a lead clinching means and has a third holding means 8 for holding the extension pins 3. The case 21 is provided at an upper portion thereof with two holes 22 corresponding to the pitch of the mount holes 7a of the printed circuit board 7. The case 21 accommodates therein fixed guide members 23 for guiding the extension pins 3 and the above-mentioned third holding means 8 which are supported via springs 24 and movable vertically by a drive means (not shown).

Before the extension pins 3 are inserted into the mount holes 7a of the circuit board 7, the third holding means 8 is made to stand by at a predetermined upper position, i.e., just above the fixed guide members 23. When the extension pins 3 pass through the mount holes 7a of the circuit board 7 and are inserted into the holes 22 of the case 21 to arrive at the third holding means 8, the second clamp 5 is opened, as mentioned above in reference to circle 4 of FIG. 1. item (4). Then, the electronic device 1 and the extension pins 3 are further lowered, so that the leads 1b of the device 1 are inserted into the mount holes 7a of the circuit board 7 and the third holding means 8 is lowered by the extension pins 3 against the springs 24. However, until the leads 1b of the device 1 are completely inserted into the mount holes 7a of the substrate 7, the extension pins 3 are still supported by the holes 22 of the case 21. When the third holding means 8 is lowered by the drive means (not shown) to a position as illustrated in FIG. 2, the upper ends of the extension pins 3 come away from the leads 1b and are still lowered away from the holes 22 to arrive at the fixed guide members 23. At this time, the extension pins 3 are pushed forward by suitable means, not illustrated, and fall forward as shown by an arrow A, so that the extension pins 3 are collected, in turn, in a collecting box 27.

When the collecting box 27 is filled with a suitable amount of extension pins 3, the collecting box 27 is transported to the pin supply station 30, where the extension pins 3 are first supplied as shown by an arrow B into a vibration. type supplying machine 31 having a circular supply passage 32. In this passage 32, the extension pins 3 are arranged in tandem along a line, so that the tapered ends 3a thereof are positioned at the leading, front end. An outlet of the passage 32 is connected to a guide passage 33 extending tangentially form the vibration supplying machine 31. This guide passage 33 is connected to a separating means 42 for separating the extension pins 3 one by one while they are dropping vertically along a line. The separating means 42 includes lower and upper air cylinders 43 and 44 capable of being inserted into the passage. The lower cylinder 43 is first inserted to retain a proceeding extension pin 3. Then, the upper cylinder 44 is inserted to retain a subsequent extension pin 3, during which time the lower cylinder 43 is retracted to allow the proceeding extension pin 3 to drop into a cylindrical supply machine 35. Then, the lower cylinder 43 is inserted again and the upper cylinder 44 is retracted to allow the subsequent extension pin 3 to be retained by the lower cylinder 43. Thus, the extension pins 3 are separated, in turn, by this separating means 42 in response to the intermittent rotational movement of the supply machine 35. The supply machine 35 is provided on a periphery thereof with a plurality of vertical grooves 36 at a predetermined pitch and an outer guide plate 34, and at the lower portion with a supporting plate 41. The extension pins 3 picked up from the guide passage 33 are separated and dropped, in turn, by the above-mentioned separating means 42 and then enter one by one into the grooves 36. The supply machine 35 is rotated intermittently in a direction shown by an arrow C, so that the extension pins 3 are fed intermittently while they are being guided between the grooves 36 and the guide plate 34.

An air cylinder 37 is provided at a certain position under the supply machine 35. While the supply machine 35 is stopped, a plurality (two) of extension pins 3 are raised up at this position as shown by an arrow D by the air cylinder 37. On the other hand, adjacent the supply machine 35 there is a chuck index 38 including a lower index portion 39 provided at a periphery thereof with pin chucks (second holding means) 5, one of which is now located at a position to clamp the upper portions of the extension pins 3 which are just raised by the cylinder 37. Thus, when an insertion operation is to be started, the chuck index 38 is first lowered to the lowest position to have the pin chuck 5 clamp the extension pins 3 and then moved up. At the uppermost position, the extension pins 3 are raised away from the supply machine 35. Then, the lower index portion 39 is rotated by a certain angle until the pin chuck 5 comes to a predetermined lead inserting position above the printed circuit board 7.

The chuck index 38 also includes an upper index portion 40 coaxially arranged with the lower index portion 39 and provided at a periphery thereof with lead chucks (first holding means) 4 arranged at a position at the same angular pitch and same radius as the above-mentioned pin chucks 5, but movable up and down independently therefrom. Each of the lead chucks 4 is also movable independently in the radial direction, but usually projected outward. The leads 1b of the electronic device 1 are clamped by the lead chuck 4 at another angular position (not shown), then cut and separated from the base and adhesion tapes 1c (FIG. 1), and then rotated to a predetermined inserting position, so that a plurality (two) of leads of the device 1 come to the positions corresponding to and just above a plurality (two) of extension pins 3, respectively. Then, the pusher 6 and the first clamp (lead chuck) 4 are lowered, so that the electronic device 1 and the extension pins 3 are lowered as shown by an arrow E by the pusher 6. The leads 1b of the device 1 are thus inserted into the mount holes 7a of the printed circuit board 7, as already mentioned above.

In this embodiment, although the above-mentioned apparatus deals with an electronic device having two leads 1b, otner electronic devices having, for example, one or 3 or more leads, can also be handled by using a corresponding number of extension pins for each cycle of operation.

Also, if the extension pins 3 are made from a cheap material such as plastic, the extension pins 3 need not be collected for repeated use.

We claim:

1. An apparatus for automatically mounting an electronic device, having a body and one or more leads, on a printed circuit board by inserting said one or more leads into mount holes of said printed circuit board, said apparatus comprising:

a plurality of extension pins;

first holding means for holding said electronic device by said leads thereof at an upper side of the printed circuit board, and for releasing a holding of said leads after said leads are inserted into said extension pins;

each of said extension pins provided at an upper end thereof with a receiving means, said receiving means includes at least one of a recess, hole, and notch, to which a tip of said lead is straightly inserted;

second holding means for holding a same number of extension pins as a number of the leads of the electronic device in a vicinity of upper ends of said extension pins;

a lowering means for lowering said electronic device by pushing down said body thereof, until said leads of the electronic device are inserted into said extension pins and supported by said upper ends of said extension pins and for further lowering said electronic device until said extension pins are lowered to completely pass through said mount holes so that said leads of the electronic device are at least partially inserted into said mount holes;

third holding means for holding said extension pins by lower ends thereof at an opposite side of the printed circuit board, said second holding means further for releasing said upper ends of said extension pins after said lower ends of said extension pins come into contact with said third holding means, and said third holding means further for a withdrawal of said extension pins from said leads at said opposite side of the printed circuit board after said leads are inserted into said mount holes; and means for controlling said first, second and third holding means so that said extension pins are held and guided to the upper side of the printed circuit board so that tips of the leads are guided and inserted into said mount holes.

2. The apparatus as set forth in claim 1, wherein each of said extension pins is provided with a tapered end at another end thereof away from the receiving means, and each extension pin is guided to a respective mount hole by said tapered end.

3. The apparatus as set forth in claim 1, wherein said extension pins are made of a tube cut to a predetermined length.

4. The apparatus as set forth in claim 3, wherein said tube is made of plastic.

5. The apparatus as set forth in claim 1, wherein said apparatus further comprises a collecting means for collecting said extension pins after having passed through said mount holes of the printed circuit board, wherein said extension pins are repeatedly used.

6. The apparatus as set forth in claim 1, wherein said extension pins are made of a pipe cut to a predetermined length.

7. The apparatus as set forth in claim 6, wherein said pipe is made of plastic.

* * * * *